United States Patent
Lim et al.

(10) Patent No.: US 8,604,595 B2
(45) Date of Patent: Dec. 10, 2013

(54) MULTI-CHIP ELECTRONIC PACKAGE WITH REDUCED STRESS

(75) Inventors: Chee Chian Lim, Alor Gajah Melaka (MY); May Ting Hng, Bukit Baru Melaka (MY)

(73) Assignee: Infineon Technologies AG, Neubiberg (DE)

( * ) Notice: Subject to any disclaimer, the term of this patent is extended or adjusted under 35 U.S.C. 154(b) by 245 days.

(21) Appl. No.: 12/191,555

(22) Filed: Aug. 14, 2008

(65) Prior Publication Data

US 2009/0008756 A1    Jan. 8, 2009

Related U.S. Application Data

(63) Continuation of application No. PCT/IB2006/000526, filed on Mar. 9, 2006.

(51) Int. Cl.
  *H01L 23/495* (2006.01)
  *H01L 23/538* (2006.01)

(52) U.S. Cl.
  USPC ............................ 257/668; 257/724; 257/783

(58) Field of Classification Search
  USPC .......... 257/668, 670, 226, 444, 427, 676–678
  See application file for complete search history.

(56) References Cited

U.S. PATENT DOCUMENTS

| | | | |
|---|---|---|---|
| 5,057,906 A | | 10/1991 | Ishigami |
| 5,084,753 A | | 1/1992 | Goida et al. |
| 5,208,188 A | * | 5/1993 | Newman ........................ 156/310 |
| 5,350,947 A | * | 9/1994 | Takekawa et al. ............. 257/702 |
| 5,438,216 A | * | 8/1995 | Juskey et al. .................. 257/434 |
| 5,994,768 A | | 11/1999 | Fogelson |
| 6,300,673 B1 | * | 10/2001 | Hoffman et al. ............... 257/666 |
| 2005/0093121 A1 | * | 5/2005 | Chen et al. ..................... 257/678 |
| 2007/0035001 A1 | * | 2/2007 | Kuhmann et al. ............. 257/680 |

FOREIGN PATENT DOCUMENTS

| | | | |
|---|---|---|---|
| EP | 0767494 A2 | | 4/1997 |
| JP | 01296647 | * | 11/1989 |
| JP | 04030563 | | 2/1992 |
| WO | 8806348 | | 8/1988 |

* cited by examiner

*Primary Examiner* — David Vu
*Assistant Examiner* — Earl Taylor
(74) *Attorney, Agent, or Firm* — Murphy, Bilak & Homiller, PLLC

(57) ABSTRACT

An electronic component includes lead fingers and a die paddle. A tape pad is mounted below the lead fingers and the die paddle. A first semiconductor chip is bonded onto the tape pad by a layer of first adhesive and a second semiconductor chip is bonded onto the die paddle by a layer of second adhesive. Electrical contacts are disposed between the contact areas of the semiconductors chips and the lead fingers. An encapsulating compound covers part of the lead fingers, the tape pad, the semiconductor chips and the electrical contacts.

20 Claims, 2 Drawing Sheets

FIG 1 A-A
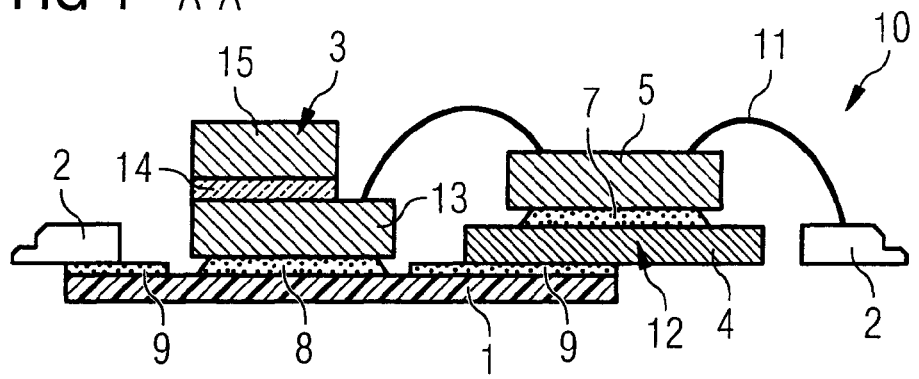
FIG 2
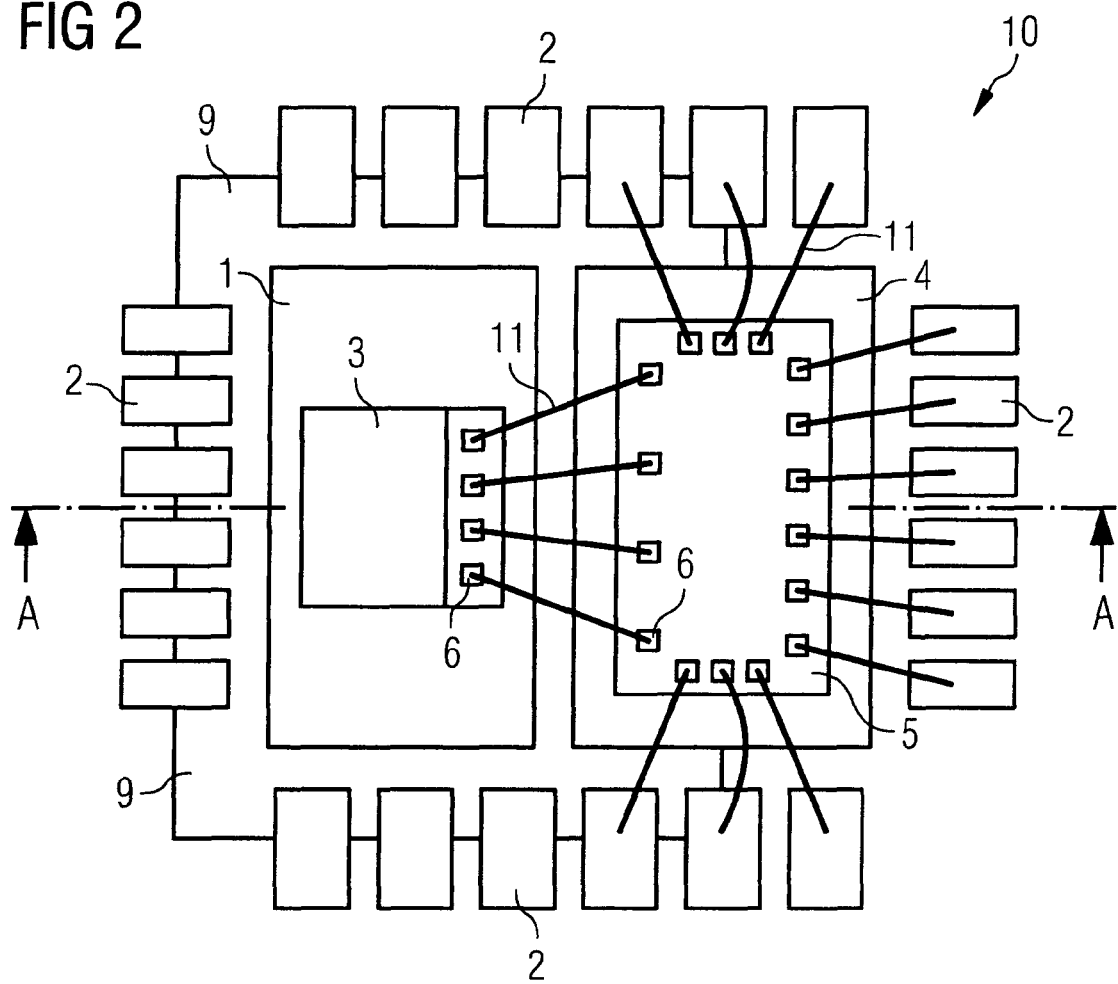

MULTI-CHIP ELECTRONIC PACKAGE WITH REDUCED STRESS

CROSS REFERENCE TO RELATED APPLICATIONS

This application is a continuation of International Application No. PCT/IB2006/000526, filed on Mar. 9, 2006, entitled "A Multi-Chip Electronic Package with Reduced Stress," the entire contents of which are hereby incorporated by reference.

BACKGROUND

Conventional construction of an electronic package with multiple semiconductor chips uses a lead frame with multiple die pads. As the coefficients of thermal expansion of the semiconductor chip and the die pad differs, chips that are sensitive to stress suffer from this manufacturing technique. This is especially so for the semiconductor chip, which incorporates a glass layer as this is sensitive to mechanical stress. Furthermore, there is difficulty in aligning the multiple die pads with lead fingers of the lead frame. The wire bonding operation requires an accurate placement of the die pad with respect to the lead fingers.

A known method to relieve stress in a semiconductor chip includes coating the semiconductor chip with silicon gel. However, this method suffers from difficulty in getting a consistent silicon gel coating.

SUMMARY

Described herein are an electronic component and a method of assembling a reliable multi-semiconductor chip package with reduced stress.

An electronic component produced according to the method comprises a lead frame, which in turn comprises lead fingers and a die paddle. A tape pad is mounted below the lead fingers and the die paddle. A first semiconductor chip is bonded to the tape pad by a layer of die adhesive, such as epoxy resin. A second semiconductor chip is bonded to the die paddle by a layer of the die adhesive. Electrical contacts (e.g., electrical wires) provide electrical connections between contact areas of the semiconductor chips and between the contact areas of the semiconductor chips and the lead fingers. An encapsulating compound encloses at least part of part of the lead frame, the tape pad, the semiconductor chips and the electrical contacts.

An advantage of the described method is that the semiconductor chip placed on the tape pad has a lower height since its base is lower than the base of the semiconductor chip that is placed on the die paddle. This is of advantage as it reduces the package height requirement demanded by tall semiconductor chip.

The surface of the tape pad deters any excessive die adhesive from reaching the back of the die paddle. Excessive adhesive at the back of the die paddle may tilt the die paddle out of position. In turn, this could affect the attachment of electrical contacts (e.g., electrical wires) between the semiconductor chip and the die paddle.

According to the described method, the tape pad further comprises a layer of tape adhesive, which inhibits parts attached to the tape pad from shifting. Furthermore, the tape pad preferably comprises a material that has high tensile modulus, which makes the tape pad rigid. This tends to prevent the parts that are attached to it from shifting. Parts that are connected to the tape pad are the lead fingers and the die paddle of the lead frame. Shifting of these parts may affect machine placement of the electrical contacts between the parts.

According to the described method, the layer of tape adhesive on the tape pad includes an opening for the placement of the semiconductor chip. The opening allows for the provision of die adhesive on the tape pad for the direct bonding of the first semiconductor chip onto the die pad.

According to the described method, the tape pad comprises a material that can tolerate 200° C. (degrees Celsius). Molten encapsulating compound surrounds the tape pad during package encapsulation. The encapsulation compound has a melting point of about 170° C. This feature allows the tape pad to withstand the molding process.

According to the described method, the die paddle is at least partly covering the tape pad. The attachment of die paddle to the tape pad keeps the die paddle fixed with respect to the lead fingers.

According to another embodiment of the described method, the die paddle may be fully on top of the tape pad. In this embodiment, the tape pad is enlarged to cover fully the die paddle and preferably large enough for all lead fingers to be attached to the tape pad. This further enhances fixing the position of the die paddle with respect to the lead fingers.

According to the described method, the first semiconductor chip includes a layer of glass. This layer of glass provides a bonding such as a hermetic seal between the upper portion of the first semiconductor chip that is above the layer of glass and the lower portion of first semiconductor chip that is below the layer of glass. An example of the first semiconductor chip is a silicon cap above the layer of glass and a micro-electrical mechanical system device (e.g., an accelerometer) below the layer of glass.

In prior art, the first semiconductor chip within the encapsulation package experiences a shifting force, especially at extreme temperature, from the mismatch of thermal expansion between the first semiconductor chip and the die paddle. An advantage of the described method is that this mismatch of thermal expansion is reduced. The layer of glass is sensitive to stress exerted by the shifting force. The first semiconductor chip experiences extreme temperature during electronic component testing and end-user application.

According to the described method, the electrical contacts comprise bonding wires, which provide electrical connection between the contact areas of the semiconductor chip and the lead fingers.

According to the described method, the die adhesive is electrically conductive. This provides an electrical path between the rear surface of the semiconductor chip and the tape pad. Optionally, a further electrical path is provided between the tape pad and an electrical ground.

A method of fabricating an electronic component comprises the provision of a lead frame on a tape pad. Next, a bonding compound such as epoxy resin is provided on the chip placement areas of both the die paddle and the tape pad. Subsequently, a first semiconductor chip is attached to the chip placement area of the tape pad and a second semiconductor chip is attached to the chip placement area of the die paddle. Following this, electrical contacts (e.g., electrical wires) are connected between contact areas of the semiconductor chips and the lead fingers. Thereafter, at least part of the lead fingers, the semiconductor chips, the tape pad and the electrical contacts are covered with an encapsulating compound.

Optionally, the described method of fabricating includes the further step of providing a layer of tape adhesive on the tape pad. This step is optionally taken prior to the step of providing a lead frame on a tape pad.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to accompanying drawings, where:

FIG. 1 shows a cross section view of an electronic component according to the described method of fabrication;

FIG. 2 shows a top view of the electronic component of FIG. 1; and

DETAILED DESCRIPTION

Figure 3:
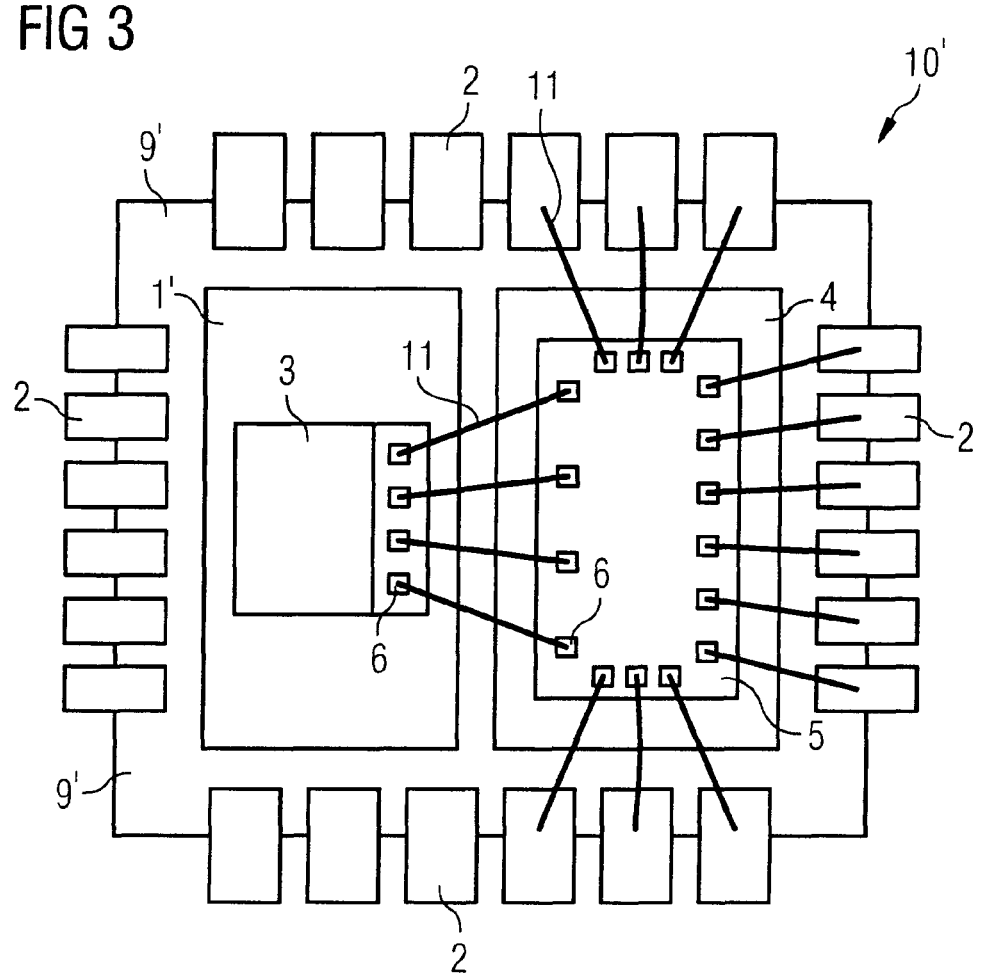
FIG. 3 shows a top view of a further embodiment of an electronic component according to the described method of fabrication.

In the following paragraphs, exemplary embodiments of the device and method are described in connection with the figures.

FIG. 1 shows a cross section view of an electronic component 10 according to an embodiment and FIG. 2 shows a top view of the electronic component 10.

The bottom of FIG. 1 shows a horizontal tape pad 1. Over the tape pad 1 is placed a lead frame 12. A first semiconductor chip 3 is provided above the central portion of the tape pad 1. The lead frame 12 comprises a die paddle 4 and lead fingers 2. Above the die paddle 4 is provided a second semiconductor chip 5. A layer of encapsulation compound covers the tape pad 1, the die paddle 4, the first and second semiconductor chips 3 and 5, and at least part of the lead fingers 2. The encapsulation compound is not shown in the FIG. 1.

As one can see in FIG. 2, the lead fingers 2 and the die paddle 4 are placed on the periphery of the tape pad 1. The lead fingers 2 are partly placed over the left, top and bottom edge of the tape pad 1 (i.e., a portion of the lead fingers extends beyond the periphery or edge of the tape pad 1). The die paddle 4 is partly placed over the right edge of the tape pad 1 (i.e., a portion of the die paddle 4 extends beyond the periphery or edge of the tape pad 1).

The first semiconductor chip 3 may be, for example, taller than the second semiconductor chip 5 due to its sensor function. However, since the chip 3 is placed directly above the tape pad 1, the bottom surface of the chip 3 is lower than the bottom surface of the chip 5. This reduces the overall package height requirement of the electronic component 10.

The first semiconductor chip 3 comprises a sensor unit 13 that is located at the bottom of the first semiconductor chip 3. Above the sensor unit 13 is disposed a layer of glass 14 and above that is placed a silicon cap 15. The sensor unit 13 measures the acceleration of its own motion. The glass layer 14 provides a hermetic seal between the silicon cap 15 and the sensor unit 13. The silicon cap 15 provides a shield over the sensor unit 13.

A thermal expansion mismatch between the first semiconductor chip 3 and the tape pad 1 is less than the mismatch between the chip 3 and the die paddle 4. The different coefficients of thermal expansion between the chip 3 and the tape pad 1 at elevated temperature results in a shift of the chip 3. However, the encapsulation compound (not pictured) covering the chip 3 restrains this shift. Therefore, a shifting force is exerted on the chip 3 at elevated temperature. The glass layer 14 is sensitive to stress exerted by the shifting force. The first semiconductor chip 3 experiences extreme temperature during electronic component testing and end-user application.

Both semiconductor chips 3 and 5 contain electrical circuits and contact pads 6 that are connected to the electrical circuits. Electrical wires 11 are attached between the contact pads 6 of the semiconductor chips 3 and 5 and between the contact pads 6 of the second semiconductor chip 5 and the lead fingers 2.

The tape pad 1 comprises a polymer material such as polyimide that tolerates 200° C. (degrees Celsius) and has a high tensile modulus of about 5,000 megapascal. Molten encapsulation compound surrounds the tape pad 1 during package encapsulation. Molten encapsulating compound has a temperature of approximately 170° C. The high tensile modulus of the tape pad 1 means that it is stiff or rigid, which in turn means that shift of the parts attached to it is reduced or limited.

A layer of third adhesive 9 with a central opening is placed between the top surface of the tape pad 1 and the bottom surface of the lead frame 12. The third adhesive 9 bonds the lead fingers 2 and the die paddle 4 to the tape pad 1 and deter them from shifting. Shifting may affect the machine placement of electrical wires 11 between the lead fingers 2 and the semiconductor chips 3 and 5.

A layer of first adhesive 8 is provided below the first semiconductor chip 3. Similarly, a second adhesive 7 is provided below the second semiconductor chip 5. The first and second adhesives 7 and 8 provide bonding and electrical conductivity between the chips 3 and their substrate. The first and second adhesives 7 and 8 comprise silver filled epoxy resin, which has strong adhesion and electrical conductivity. The broad surface of the tape pad 1 prevents any excessive adhesives 7 and 8 from spilling and reaching the back of the die paddle 4

FIG. 3 shows a top view of a further electronic component 10' according to another embodiment. The further electronic component 10' includes features similar to the features of electronic component 10 of FIGS. 1 and 2.

The distinction between the further electronic component 10' and the electronic component 10 is the larger tape pad 1' and the corresponding larger surface area of the third adhesive 9' that is above the tape pad 1'. The layer of third adhesive 9' provides bonding between the tape pad 1' and the lead fingers 2 as well as the die paddle 4 and keeps or prevents them from shifting.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component comprising:
a lead frame including lead fingers and a die paddle;
a tape pad disposed below the lead fingers and the die paddle;
a first semiconductor chip comprising a sensor unit, wherein the first semiconductor chip is bonded directly to the tape pad by a layer of first adhesive, the first adhesive extending between the first semiconductor chip and the tape pad;

a second semiconductor chip bonded to the die paddle by a layer of second adhesive;

electrical contacts connecting respective ones of the contact areas of the semiconductor chips and/or connecting respective ones of the contact areas of the semiconductor chips and the lead fingers; and an encapsulating compound covering at least part of the lead fingers, the tape pad, the semiconductor chips, and the electrical contacts, wherein the tape pad is formed from a polymer material possessing a tensile modulus effective to limit shifting caused by thermal expansion of the first semiconductor chip and the die paddle.

2. The electronic component of claim 1, further comprising: a layer of third adhesive disposed on the surface of the tape pad bonding the tape pad to the lead frame.

3. The electronic component of claim 2, wherein the layer of third adhesive includes a central opening.

4. The electronic component of claim 1, wherein the tape pad comprises a material that tolerates 200 degrees Celsius.

5. The electronic component of claim 1, wherein the portion of the tape pad disposed below the die paddle is disposed below only a portion of the die paddle.

6. The electronic component of claim 1, wherein the first semiconductor chip comprises of a layer of glass.

7. The electronic component of claim 1, wherein the electrical contacts comprise bonding wires.

8. The electronic component of claim 1, wherein the first and second adhesives are electrically conductive.

9. The electronic component of claim 1, wherein the tape pad is formed from a polyimide.

10. The electronic component of claim 9, wherein the polyimide possesses a tensile modulus of about 5,000 MPa.

11. The electronic component 1, wherein the first semiconductor chip comprises:

a micro-electrical mechanical system device bonded to the tape pad via a layer of adhesive;

a glass layer disposed on a micro-electrical mechanical system device; and a silicone cap disposed on the glass layer.

12. The electronic component of claim 1, wherein the thermal expansion difference between the first semiconductor chip and the tape pad is less than the thermal expansion difference between the first semiconductor chip and the die paddle.

13. An electronic component comprising:

a polymeric tape pad;

a first semiconductor chip directly bonded to the tape pad by a layer of first adhesive is disposed between and in is direct contact with the first semiconductor chip and the tape pad, the first semiconductor chip comprising a micro-electrical mechanical system device;

a lead frame including lead fingers and a die paddle;

a second semiconductor chip directly bonded to the die paddle by a layer of second adhesive such that the layer of second adhesive is disposed between and is in direct contact with each of the second semiconductor chip and the die paddle;

a first plurality of electrical contacts connecting contact areas of the first semiconductor chip and the second semiconductor chip;

a second plurality of electrical contacts connecting contact areas of the second semiconductor chip and the lead fingers; and wherein the tape pad is formed from a polymer material possessing a tensile modulus effective to limit shifting caused by thermal expansion of the first semiconductor chip and the die paddle, and wherein a thermal expansion mismatch existing between the first semiconductor chip and the tape pad is less than the thermal expansion mismatch existing between the first semiconductor chip and the die paddle.

14. The electronic component of claim 13, wherein the polymeric tape pad comprises a polyimide possessing a tensile modulus of about 5,000 MPa.

15. The electronic component of claim 1, wherein the tape pad consists essentially of a polymer material possessing a tensile modulus effective to limit shifting caused by thermal expansion of the first semiconductor chip and the die paddle.

16. The electronic component of claim 13, wherein the tape pad consists essentially of a polymer material possessing a tensile modulus effective to limit shifting caused by thermal expansion of the first semiconductor chip and the die paddle.

17. The electronic component of claim 13 further comprising an encapsulation compound covering the tape pad, the die paddle, the semiconductor chips, and part of the lead fingers.

18. The electronic component of claim 13, wherein the die paddle extends beyond a peripheral edge of the tape pad.

19. The electronic component of claim 13, wherein a distance between the tape pad and a bottom surface of the first semiconductor chip is less than a distance between the tape pad and a bottom surface of the second semiconductor chip.

20. The electronic component of claim 19, wherein the first semiconductor chip comprises, in order, the micro-electrical mechanical system device bonded to the tape pad via the layer of first adhesive, a glass layer disposed on micro-electrical mechanical system device, and a silicon cap disposed on the glass layer, wherein the glass layer provides a hermetic seal between the silicon cap and the micro-electrical mechanical system device.

* * * * *